United States Patent [19]
Yarborough, Jr.

[11] Patent Number: 4,594,564
[45] Date of Patent: Jun. 10, 1986

[54] FREQUENCY DETECTOR FOR USE WITH PHASE LOCKED LOOP

[75] Inventor: John M. Yarborough, Jr., Palo Alto, Calif.

[73] Assignee: Signetics Corporation, Sunnyvale, Calif.

[21] Appl. No.: 619,096

[22] Filed: Jun. 11, 1984

[51] Int. Cl.[4] .............................................. H03L 7/00
[52] U.S. Cl. ..................... 331/1 A; 307/525; 307/526; 328/133; 328/134; 331/25
[58] Field of Search ............... 307/525, 526; 328/133, 328/134; 329/122; 331/1 A, 25, 27

[56] References Cited

U.S. PATENT DOCUMENTS

| | | | |
|---|---|---|---|
| 3,458,823 | 7/1969 | Nordahl | 328/155 |
| 3,714,463 | 1/1973 | Laune | 307/526 |
| 3,835,413 | 9/1974 | Epstein | 331/1 A |
| 3,908,174 | 9/1975 | Hamada | 331/11 |
| 4,277,754 | 7/1981 | Minakuchi | 307/525 X |
| 4,308,505 | 12/1981 | Messerschmitt | 331/25 |
| 4,363,004 | 12/1982 | Englund | 331/8 |
| 4,378,509 | 3/1983 | Hatchett et al. | 307/528 |

Primary Examiner—Eugene R. LaRoche
Assistant Examiner—James L. Lee
Attorney, Agent, or Firm—Robert T. Mayer; Bernard Franzblau

[57] ABSTRACT

A frequency detector receiving two input frequencies and generating a pump-up/pump-down signal for control of a phase locked loop by matching the frequency of a voltage controlled oscillator to the frequency. The lock is independent of the phase relationship of the signals.

9 Claims, 4 Drawing Figures

FREQUENCY DETECTOR FOR USE WITH PHASE LOCKED LOOP

BACKGROUND OF THE INVENTION

1. Field of the Invention

This invention pertains to the general field of frequency detectors and in particular pertains to a circuit which receives two input frequencies and generates a pump-up/pump-down signal for the control of a phase locked loop or a frequency locked loop. The circuit can be used in the construction of such loops where it is desirable for the lock to be independent of the phase relationship between two signals.

2. Description of the Prior Art

The initial acquisition of a phase locked loop when used for timing or carrier extraction is a significant practical problem, since the narrow bandwidth generally required for jitter requirements severely restricts the pull-in range. In the prior art many methods have been used to effect the acquisition. These methods are summarized in an article entitled "Frequency Detectors for PLL Acquisition in Timing and Carrier Recovery", David G. Messerschmitt, IEEE Transactions on Communications, Vol. Com-27, No. 9, September 1979. This article also discusses two specific frequency detectors, each of which is applicable to both timing and carrier recovery. The first is of the quadricorrelator type using classical linear techniques. Such a frequency detector is also discussed in U.S. Pat. No. 4,308,505. The second is a rotational frequency detector implemented with digital circuitry. Both of these frequency detectors differ from that disclosed in the present invention. The present invention presents a digital circuit which does not use a quadrature scheme. A number of recent patents, including U.S. Pat. No. 4,378,509, disclose circuits which lock on both phase and frequency. These patents differ from the present invention which does not lock on phase. Other prior art patents disclose frequency detectors using classical analog discrimination schemes or circuits which compare the output of two frequency counters, both types of frequency detectors differ from that of the present invention.

SUMMARY OF THE INVENTION

The circuit of the present invention consists of an interconnection of digital logic elements, the circuit receiving two input frequencies and generating a pump-up/pump-down signal for the control of a phase locked loop, or more correctly in this case, a frequency locked loop. The circuit is designed for use in the construction of such loops where it is desirable for the lock to be independent of the phase relationship between the two signals. In addition, the detector prevents the loop from locking up on signals that are harmonically related but not identical in frequency.

The two frequency inputs come from a crystal oscillator and a voltage controlled oscillator, the former being the reference input while the latter is the output of the loop's voltage controlled oscillator. The output of the circuit is the frequency pump. The inputs are assumed to be digital signals with a fixed frequency. The signals however need not be square waves since only one edge has an effect on the circuit. The output, which in a typical application is sent through a low-pass filter before being used to control the frequency of the voltage controlled oscillator, has three states: a pump-up, in which case the signal can be thought of as being connected to the positive supply; pump-down, in which case the signal can be thought of as being connected to ground; and inactive, in which case the signal can be thought of as being an open circuit. These states are identical to those of a three state driver. The circuit functions such that when the frequency of the crystal controlled oscillator is greater than that of the voltage controlled oscillator over the course of one cycle of the crystal controlled oscillator and one cycle of the voltage controlled oscillator, there will be a net pump-up signal. When the frequency of the crystal controlled oscillator is less than that of the voltage controlled oscillator, there will be a net pump-down signal. These net signals are independent of the phase difference between the crystal controlled oscillator and the voltage controlled oscillator.

DESCRIPTION OF THE PREFERRED EMBODIMENT

The frequency detector of the present invention is a digital logic circuit which receives two input frequencies and generates a pump-up/pump-down signal for the control of a phase locked loop, or more correctly in this case, a frequency locked loop. The circuit can be used in the construction of such loops where it is desirable for the lock to be independent of the phase relationship between the two signals. In addition, the detector prevents the loop from locking up on signals that are harmonically related but not identical in frequency.

Figure 4:
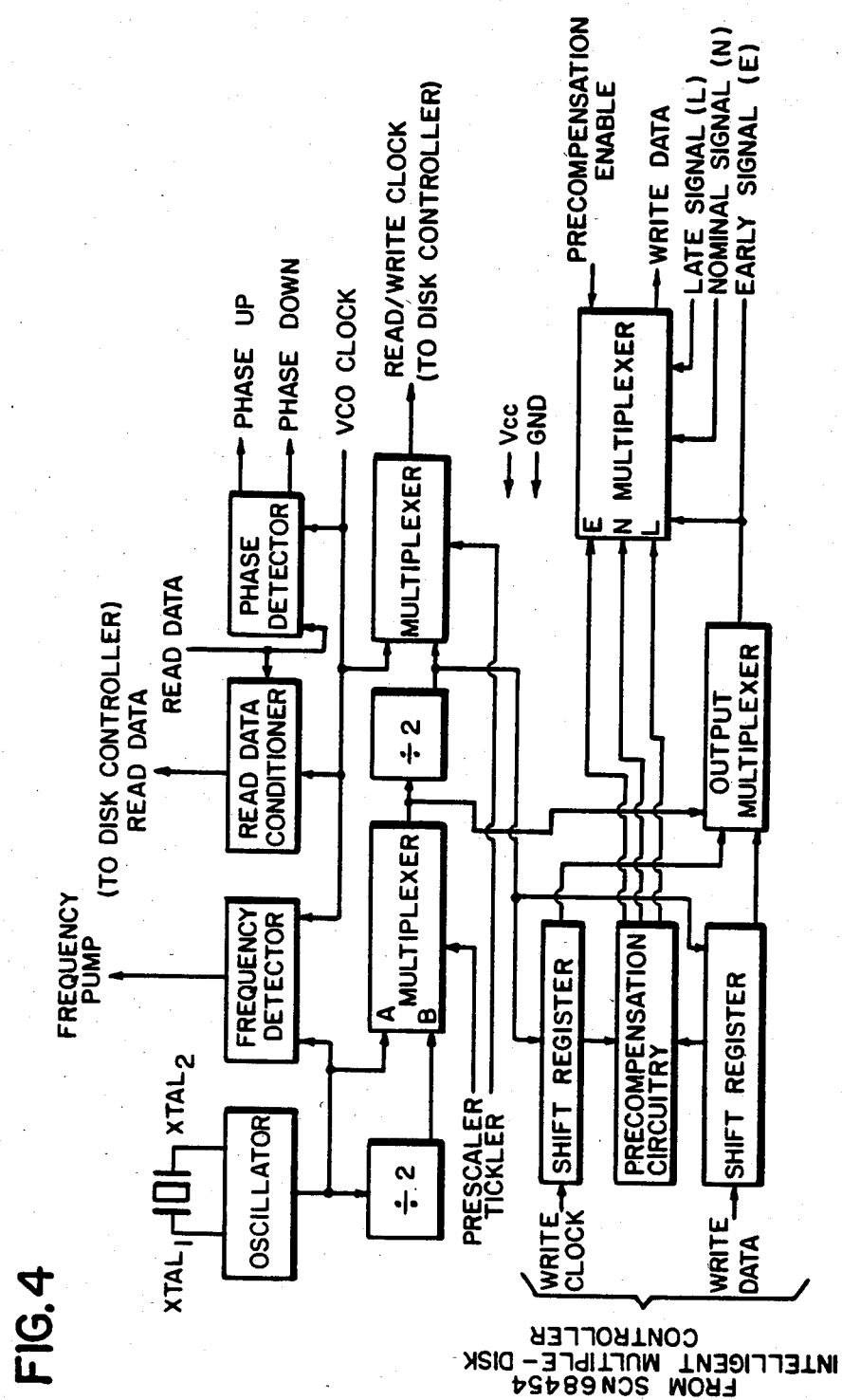
FIG. 4 is a block diagram of a disk phase locked loop circuit as embodied on an integrated circuit.

The circuit can be used as part of a disk phase locked loop, illustrated in FIG. 4 (e.g. a bipolar IC to be sold by Signetics Corp. under the designation SCB 68459) which serves as an interface between an intelligent multiple disk controller and the read/write channels of disk units. Together with an external voltage controlled oscillator, the disk phase locked loop and the intelligent multiple disk controller can provide all the functions necessary to control up to four disks with various standard interfaces. The disk phase locked loop uses an external voltage controlled oscillator for the variable clock rate which tracks the read data from the disk unit. This voltage controlled oscillator can be any device which properly interfaces to the disk phase locked loop. The disk phase locked loop operates by producing an oscillator frequency to match the frequency of an input signal. In this locked condition any slight change in the input frequency (called jitter) will appear as a change in phase between the input frequency and the voltage controlled oscillator frequency. This phase shift then acts as an error signal to change the frequency of the disk phase locked loop voltage controlled oscillator to match the input frequency. The frequency detector of the present invention is able to match the frequency of the voltage controlled oscillator with the frequency of a reference source by applying a pump-up or pump-down signal to the voltage controlled oscillator if the VCO frequency is below or above the reference frequency.

Figure 1:
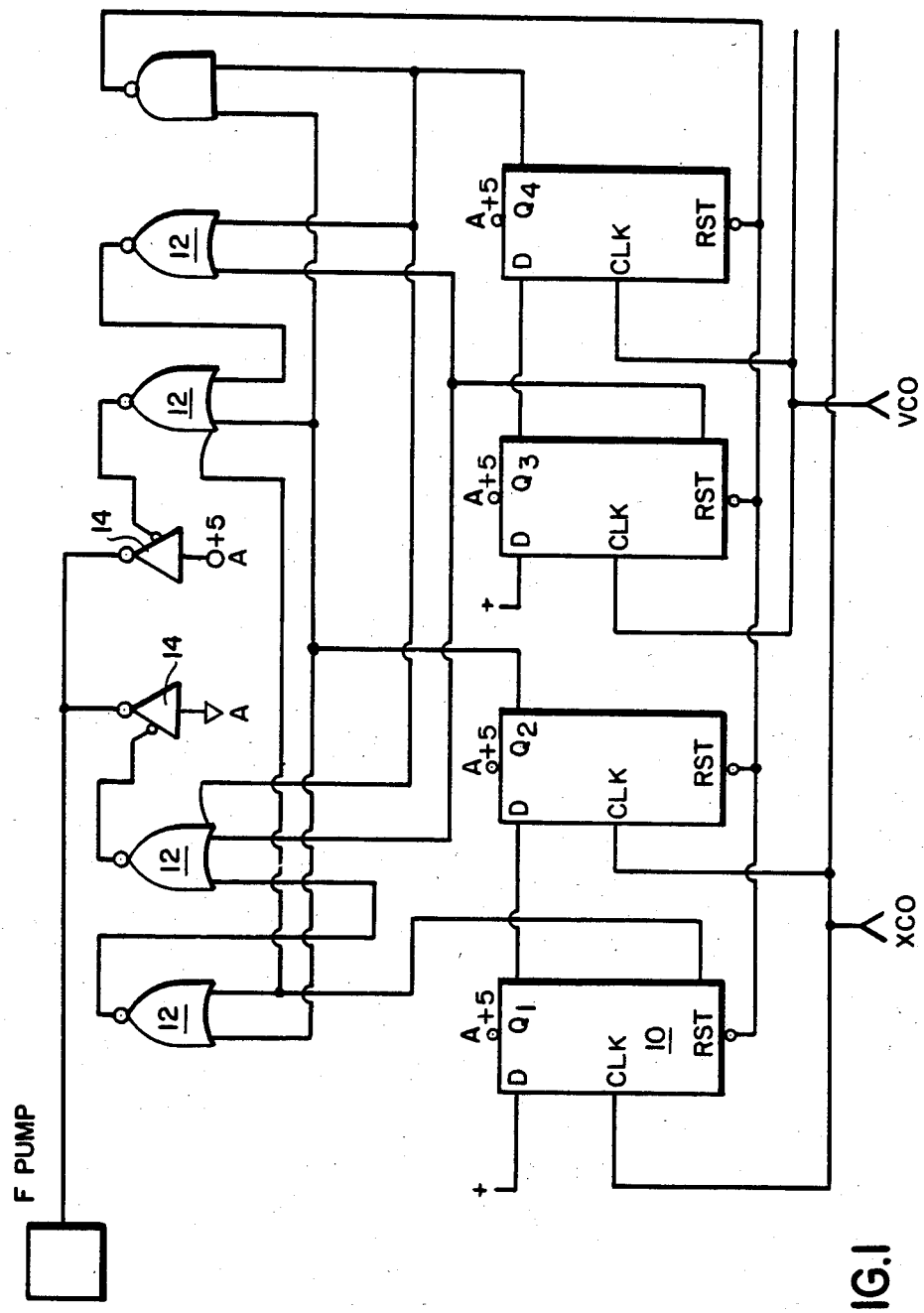
FIG. 1 is a circuit diagram for a first embodiment of the frequency detector of the present invention.

The first embodiment of the frequency detector of the present invention is illustrated in FIG. 1 using the logic elements shown therein, a series of flip-flops 10, a series of NOR-gates 12 leading to a pair of tristate drivers 14. The two frequency inputs are labeled XCO for the crystal oscillator and VCO for the voltage controlled oscillator. The XCO input is a reference input. The VCO input is the output of the loop's voltage controlled oscillator. The output of the frequency detector circuit is labeled F-pump. The inputs XCO and VCO are assumed to be digital signals with a fixed, at least on a short term basis, frequency. The signals however need not be square waves since only one edge, in the case of the embodiment of FIG. 1 the rising edge, has an effect on the circuit. The output of the circuit, which in a typical application is sent through a low-pass filter before being used to control the frequency of the voltage controlled oscillator, has three states. The first state is pump-up, in which case the signal may be thought of as being connected to the positive supply. The second state is pump-down, in which case the signal may be thought of as being connected to ground. The third state is inactive, in which case the signal can be thought of as being an open circuit. All these states are identical to those of the tristate driver 14.

The operation of the circuit is as follows.

The starting state is for the output of all four flip-flops to be in their reset or zero state. The description that follows will show that this state will be reached regardless of any arbitrary starting state. A transition on either the XCO or the VCO input will cause the flip-flop pair Q1, Q2 or Q3, Q4 to assume the state 10. The next positive edge causes the state of the affected pair to advance to 11. When both Q2 and Q4 are in the 1 state a direct clear will be effected returning the flip-flops to their original states. A list of all possible stable states for Q1, Q2, Q3, Q4 and the associated pump-on/pump-down action follows. All states of the form X1X1 are not included since they are unstable and are cleared to 0000. States of the form 01XX and XX01 are not included since they cannot be reached from the starting state 0000.

| Q1 | Q2 | Q3 | Q4 | Pup | Pdown |
|----|----|----|----|-----|-------|
| 0  | 0  | 0  | 0  | 0   | 0     |
| 0  | 0  | 1  | 0  | 0   | 1     |
| 0  | 0  | 1  | 1  | 0   | 0     |
| 1  | 0  | 0  | 0  | 1   | 0     |
| 1  | 1  | 0  | 0  | 0   | 0     |
| 1  | 1  | 1  | 0  | 0   | 1     |
| 1  | 0  | 1  | 0  | 0   | 0     |

Analysis of the results of this circuit will show that when the XCO frequency is greater than the VCO frequency over the course of one cycle of the XCO and one cycle of the VCO, there will be a net pump-up signal, that is the pump-up width will be greater than the pump-down width. When the XCO is less than the VCO there will be a net pump-down. These net signals are independent of the phase difference between the XCO and the VCO signals.

it should be noted that the circuit shown in FIG. 1 assumes that when the voltage in the VCO control input is increased, the output frequency increases. It is possible to design the circuit so that VCO circuits with reverse characteristics may be used, by redefining the relationship between the flip-flop states and the pump-up and pump-down conditions.

Figure 2:
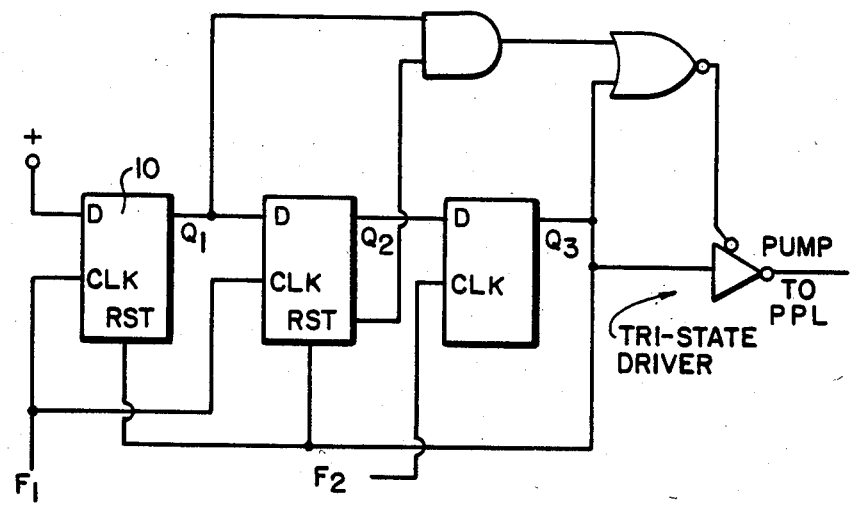
FIG. 2 is a circuit diagram for a second embodiment of the frequency detector of the present invention.

FIG. 2 illustrates an alternate embodiment of the frequency detector illustrated in FIG. 1. In FIG. 2, the number of flip-flops has been reduced to three and the number of gates reduced to two. FIG. 2 illustrates the frequency detector as implemented on the SCB68459 phase locked loop integrated circuit for use with the Motorola 68000 Series integrated circuit set. In FIG. 2, there are two inputs F1 and F2. F1 is the crystal controlled oscillator frequency or reference frequency and F2 is the voltage controlled oscillator frequency from an external voltage controlled oscillator. This voltage controlled oscillator provides the variable clock rate which tracks the read data from the disk unit. The circuit produces an oscillator frequency to match the frequency of the input signal from the VCO. In this locked condition any slight change in the input frequency (called jitter) will appear as a change in phase between the input frequency and the VCO frequency. This phase shift then acts as an error signal to change the frequency of the local voltage controlled oscillator to match the input frequency. Thus the frequency detector plays a role in generating a read clock from the incoming data from a disk unit. The frequency detector assists in providing a read/write clock which clock is either derived from a crystal or from a phase locked loop locking onto the combined data and clock stream from a disk.

Figure 3:
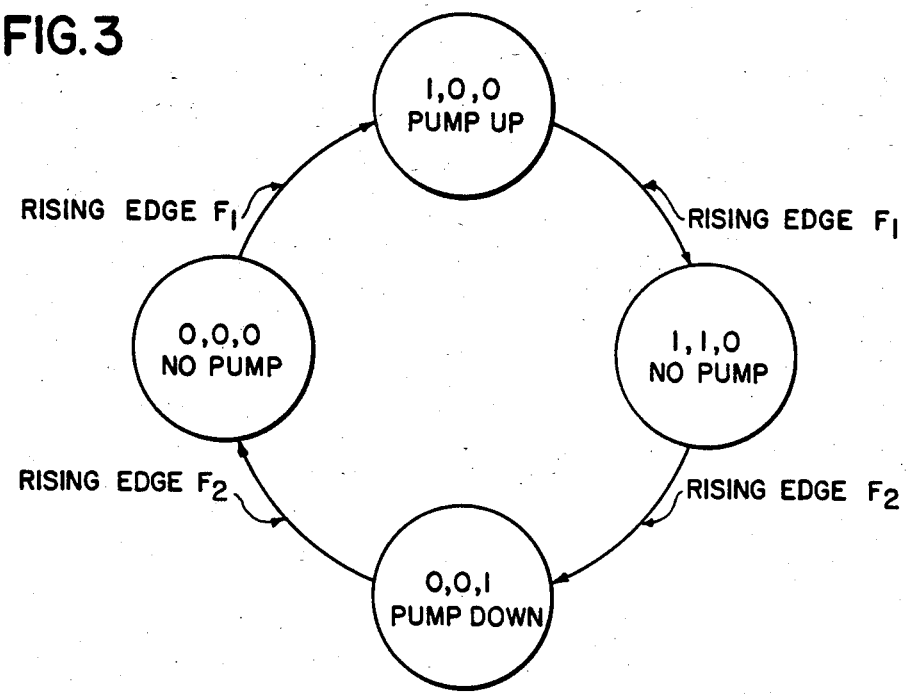
FIG. 3 is a diagrammatic presentation of various states of the frequency detector of FIG. 2.

FIG. 3 is a state transition diagram illustrating the operation of the frequency detector as implemented on the SCB68459 phase locked loop integrated circuit. This state diagram shows that the circuit pumps up for one full cycle of F1 which is then followed by a pump-down for a full cycle of F2, thus giving a net pump signal proportional to the net frequency difference between F1 and F2.

I claim:

1. A frequency detector for use with a phase locked loop that includes a voltage controlled oscillator (VCO) comprising:
   a first input for a first digital signal representing a reference frequency,
   a second input for receiving a second digital signal representing the frequency of the VCO of the phase locked loop,
   at least one tri-state driver circuit having an output for deriving at least a frequency pump-up or a frequency pump-down signal for the VCO,
   first, second and third bistable devices,
   means coupling an input of the first bistable device and an input of the second bistable device to said first input,
   means coupling an input of the third bistable device to said second input,
   means coupling an output of the first bistable device to a second input of the second bistable device, and
   a logic circuit having input means coupled to outputs of the bistable devices and output means coupled to input means of the driver circuit to control the driver circuit to provide a pump-up or pump-down signal as its output determined by the relative frequency difference of first and second digital input signals at said first and second inputs and independently of a phase difference between the input signals.

2. A frequency detector as claimed in claim 1 further comprising means coupling a reset input of the first and second bistable devices to an output of the third bistable device.

3. A frequency detector as claimed in claim 1, wherein the logic circuit comprises:
   a first gate having a first input coupled to the output of the first bistable device and a second input coupled to a first output of the second bistable device, and
   a second gate having a first input coupled to an output of the first gate and a second input coupled to the output of the third bistable device,
   said frequency detector further comprising:
   means coupling said output of the third bistable device to reset inputs of the first and second bistable devices, and
   means coupling a second output of the second bistable device to a further input of the third bistable device.

4. A frequency detector as claimed in claim 3, wherein said bistable devices each comprise a D-type flip-flop, said inputs of the first and second bistable devices that are coupled to the first input comprising the clock inputs of said D-type flip-flops, the input of the third bistable device coupled to the second input comprising the clock input of said D-type flip-flop, said second input of the second bistable device comprising the D-input thereof and the further input of the third bistable device comprising the D-input thereof.

5. A frequency detector as claimed in claim 2 further comprising a fourth bistable device having a first input coupled to the second input and a second input coupled to an output of the third bistable device, and
   means coupling an output of the logic circuit to reset inputs of each of the bistable devices.

6. A frequency detector as claimed in claim 5 further comprising:
   means coupling a second output of the first bistable device to a first gate of the logic circuit,
   means coupling an output of the second bistable device to a second input of the first gate,
   means coupling a second output of the third bistable device to a first input of a second gate of the logic circuit, and
   means coupling an output of the fourth bistable device to a second input of the second gate.

7. A frequency detector as claimed in claim 6, wherein said bistable devices each comprise a D-type flip-flop with clock inputs of the first and second bistable devices coupled to the first input, and clock inputs of the third and fourth bistable devices coupled to the second input.

8. A frequency detector as claimed in claim 5, wherein said bistable devices each comprise a D-type flip-flop with clock inputs of the first and second bistable devices coupled to the first input, and clock inputs of the third and fourth bistable devices coupled to the second input.

9. A frequency detector for use with a phase locked loop that includes a voltage controlled oscillator (VCO) comprising:
   a first input for a first digital signal representing a reference frequency,
   a second input for a second digital signal representing the frequency of the VCO of the phase locked loop,
   a tri-state drive circuit having an output for deriving a frequency pump-up or a frequency pump-down signal for the VCO,
   means coupling an input of a first bistable device and an input of a second bistable device to said first and second inputs, respectively, and
   a logic circuit coupled between outputs of the bistable devices and input means of the drive circuit to control the drive circuit to provide a pump-up or pump-down signal at its output determined by the relative frequency difference of first and second digital input signals at said first and second inputs and independently of a phase difference between the input signals.

* * * * *